United States Patent [19]

Iwamatsu

[11] 4,077,012
[45] Feb. 28, 1978

[54] AMPLIFIER DEVICES

[75] Inventor: Masayuki Iwamatsu, Hamamatsu, Japan

[73] Assignee: Nippon Gakki Seizo Kabushiki Kaisha, Japan

[21] Appl. No.: 762,926

[22] Filed: Jan. 26, 1977

[30] Foreign Application Priority Data

Jan. 28, 1976 Japan ............................. 51-7590[U]

[51] Int. Cl.² ........................................... H03F 3/45
[52] U.S. Cl. ................................... 330/253; 330/260
[58] Field of Search .................. 330/24, 28, 30 D, 35

[56] References Cited

U.S. PATENT DOCUMENTS

| | | | |
|---|---|---|---|
| Re. 28,184 | 10/1974 | Beck et al. | 330/30 D |
| 3,370,242 | 2/1968 | Offner | 330/35 UX |
| 3,512,099 | 5/1970 | Ohwada | 330/30 D |
| 3,914,704 | 10/1975 | Craft | 330/30 D X |

Primary Examiner—James B. Mullins
Attorney, Agent, or Firm—Charles W. Helzer

[57] ABSTRACT

In an amplifier device of the type comprising a differential amplifier including a pair of parallel-connected field effect transistors, an emitter grounded transistor responsive to the output of the differential amplifier and acting as class "A" amplifier, an output terminal connected to the collector electrode of the emitter grounded transistor and a constant current drive circuit connected to the commonly connected source electrodes of the field effect transistors, a feedback resistor is connected between the output terminal and the constant current drive circuit for modulating the current of the constant current drive circuit in accordance with the amplitude of the output signal.

5 Claims, 12 Drawing Figures $I_C = 2.5mA$
$I_C = 1.5mA$
$I_C = 0.5mA$ $g_m = K \cdot \sqrt{I_D}$

AMPLIFIER DEVICES

BACKGROUND OF THE INVENTION

This invention relates to an amplifier device, more particularly a transistor amplifier device capable of eliminating a secondary distortion caused by the variation in the current amplification coefficient of the transistor at any load resistance due to the variation in the collector current.

A typical prior art amplifier device shown in FIG. 1 comprises a first stage constituted by a pair of field effect transistors and a second stage constituted by an emitter grounded transistor having a constant current load. As shown, the amplifier device comprises an input terminal 10 adapted to receive an input signal, an output terminal 11, a differential amplifier constituted by a pair of junction type field effect transistors 12 and 13, a PNP transistor 14 acting as a class "A" amplifier, and NPN transistors 15 and 16. The transistor 16 constitutes a constant current drive circuit for the differnetial amplifier constituted by the field effect transistors 12 and 13. The drain electrode of the field effect transistor 12 is connected to the base electrode of the transistor 14 and to the positive pole +B of a voltage source through a resistor 18, and the source electrode is connected to the source electrode of the field effect transistor 13 and these source electrodes are connected to the collector electrode of the transistor 16 in common. The gate electrode of the field effect transistor 12 is connected to the input terminal 10. The drain electrode of the field effect transistor 13 is connected to the positive pole +B while the gate electrode is connected to the output terminal 11 via a resistor 20 and grounded by a resistor 19. The collector electrode of the transistor 14 is also connected to the output terminal 11 and the emitter electrode is connected to the positive pole +B through a resistor 21. The collector electrode of the transistor 15 is connected to the output terminal 11, the emitter electrode is connected to the negative pole −B of the voltage source via a resistor 22 and the base electrode is connected to the juncture between resistor 23 and a diode 25. The diode 25 is forwardly connected in series with a diode 26 between the negative pole −B and the resistor 23. The emitter electrode of the transistor 16 is connected to the negative pole −B via a resistor 28 and the base electrode is connected to the juncture between resistors 23 and 29, the other end of the resistor 29 being grounded. A resistor 30 is connected between the input terminal 10 and the ground.

An input signal applied to the input terminal 10 is amplified by the field effect transistor 12 and the output thereof is amplified by the transistor 14 of the second stage to produce an amplified output at the output terminal 11.

In the conventional amplifier device as shown in FIG. 1 since the first stage comprises a differential amplifier its secondary distortion is small. On the other hand, since the second stage transistor 14 constitutes a class A type amplifier its linearity directly affects distortion of the output.

FIG. 2 shows one example of the characteristics of the collector current $I_C$ with reference to the collector-emitter voltage $V_{CE}$ when the transistor 14 is operated. In FIG. 2, the ordinate represents the collector current $I_C$ and the abscissa the collector-emitter voltage $V_{CE}$. The $V_{CE} - I_C$ characteristic curves are depicted for base current $I_B$ varying with a step of 2 $\mu$A and a load resistor $R_L = 65$ Kohms.

Generally, the value of resistor 18 is sufficiently larger than the input impedance of the transistor 14 so that it can be considered that transistor 14 operates in response to a current input. Accordingly, the current amplification coefficient $h_{fe}$ of the transistor 14 varies according to the collector current $I_C$ so that a secondary distortion will appear at the output terminal. More particularly, in FIG. 2 when $I_C - \Delta_C \Delta I_B$ along the load resistance line (65 Kohms) is considered a curve as shown in FIG. 3 is obtained. FIG. 3 shows the $I_C - \Delta I_C/\Delta I_B$ characteristic where the transistor 14 comprises a transistor, for example 2SA810. When the transistor 14 is current-driven by selecting its operating point at 1.5mA, a secondary distortion as shown in FIG. 4 would always result in which the phase relationship is the same as that in FIG. 1 and wherein (a) shows the fundamental wave form, (b) the output wave form and (c) the distortion. For the purpose of decreasing the second order distortion, the transistor 14 may be replaced by a cascade circuit, or a drive impedance having a suitable value may be selected for the transistor 14. The substitution of a cascade circuit can eliminate the variation in the current amplification coefficient $h_{fe}$ caused by the variation in the collector output resistance by imposing a constant voltage load on the transistor 14 and can prevent the decrease in the bandwidth due to the collector-base capacitance Cob. However, this solution complicates the circuit construction and is not economical. According to the latter solution, that is the selection of a suitable drive impedance is preferred, wherein the variation of $V_{BE} - I_C$ characteristic has an inverse relationship in phase with respect to that of $I_B - \Delta I_C/\Delta I_B$ characteristic. It then is possible to decrease the distortion by the cancelling effect of the generated distortion where the drive impedance is suitably selected. However, this solution is not effective because the distortion caused by $V_{BE} - I_C$ characteristic contains a large quantity of higher harmonics.

SUMMARY OF THE INVENTION

Accordingly, it is an object of this invention to provide an improved amplifier device capable of eliminating the secondary distortion caused by the variation in the DC amplification coefficient of a transistor amplifier device where the collector current varies.

Another object of this invention is to provide an improved amplifier device capable of eliminating the secondary distortion by simple circuit means thereby improving the characteristics and the reliability of the amplifier device.

According to this invention there is provided an amplifier device of the class comprising a differential amplifier including a pair of parallel-connected field effect transistors, an emitter grounded transistor responsive to the output of the differential amplifier and acting as a class "A" amplifier, an output terminal connected to the collector electrode of the emitter grounded transistor, and a constant current drive circuit connected to the commonly connected source electrodes of the field effect transistors, wherein an impedance element is connected between the output terminal and the constant current drive circuit for modulating the current of the constant current drive circuit according to the amplitude of the output signal.

BRIEF DESCRIPTION OF THE DRAWINGS

Further objects and advantages of the invention can be more fully understood from the following detailed description taken in conjunction with the accompanying drawings in which.

DESCRIPTION OF THE PREFERRED EMBODIMENTS

Figure 1:
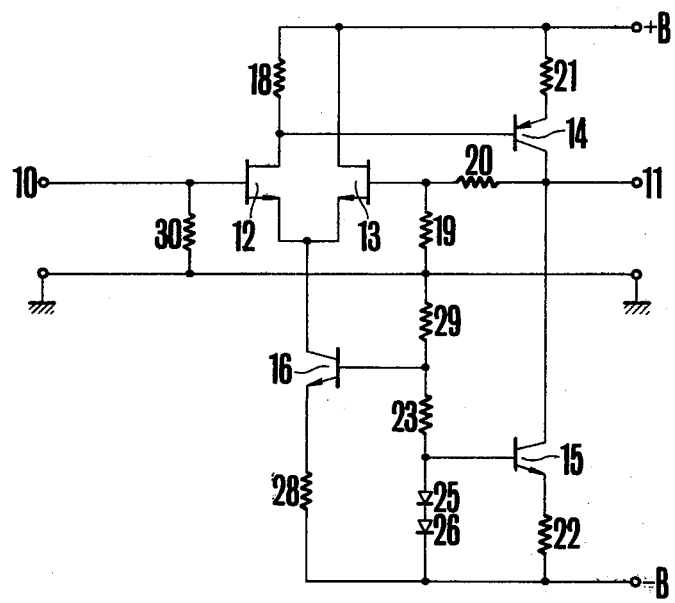
FIG. 1 is a connection diagram showing one example of a prior art two stage amplifier device.
Figure 2:
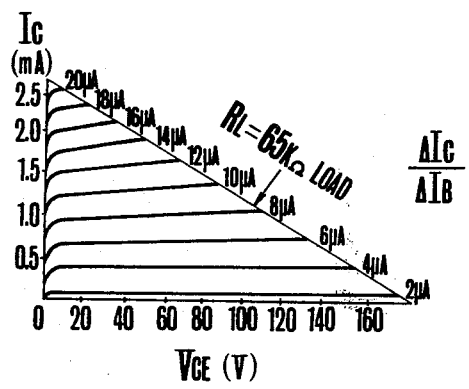
FIG. 2 shows $V_{CE} - I_C$ characteristics of a transistor (type 2SA 810)
Figure 3:
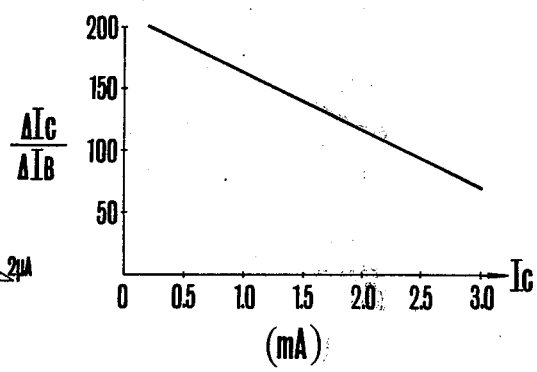
FIG. 3 shows the $I_C - \Delta I_C/\Delta I_B$ characteristic of the same transistor.
Figure 8:
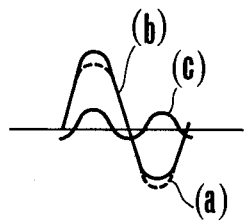
FIGS. 8 to 11 are graphs useful to explain the operation of the amplifier device shown in FIG. 5.
Figure 5:
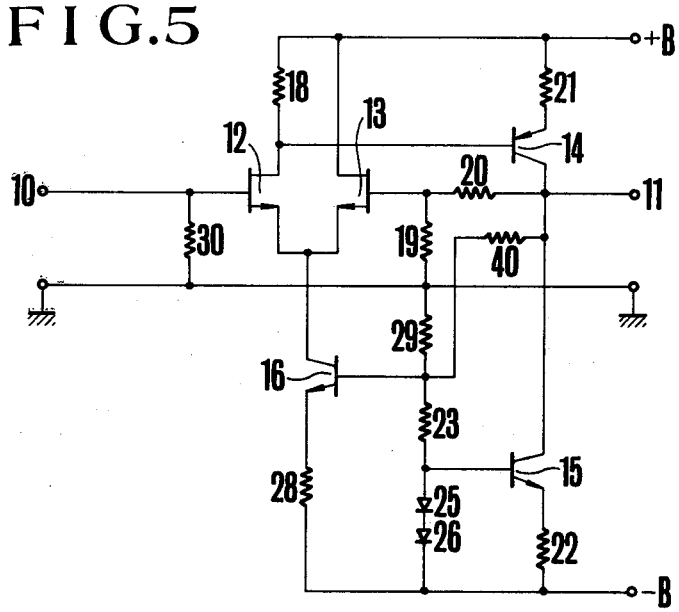
FIG. 5 is a connection diagram showing one embodiment of the amplifier device embodying the invention.
Figure 6:
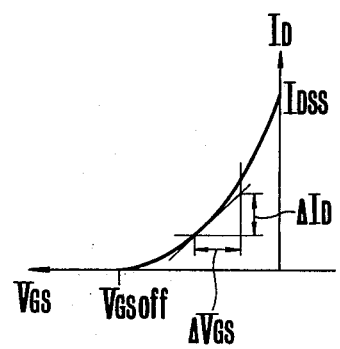
FIG. 6 shows the $V_{GS} - I_D$ characteristic of a field effect transistor.
Figure 7:
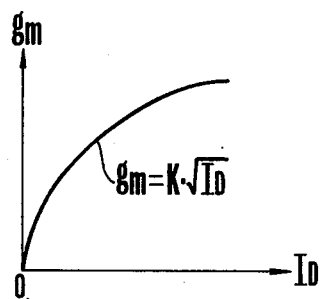
FIG. 7 shows the $I_D - gm$ characteristic of a field effect transistor.

The embodiment of the amplifier device shown in FIG. 5 is constructed to cancel the second order distortion in the second stage by forming a distortion of the inverse phase in an open loop circuit. In FIG. 5, the component elements corresponding to those shown in FIG. 1 are designated by the same reference numerals. According to this invention there is provided a resistor 40 which constitutes a current modulation circuit. One end of the resistor 40 is connected to the output terminal 11 whereas the other end is connected to the base electrode of the transistor 16 and to the juncture between the base electrode of transistor 15 and the diode 25 via resistor 23. The other end of the resistor 23 is grounded through resistor 29. Thus, the amplifier device shown in FIG. 5 is constructed such that the output signal is applied through the resistor 40 to the base circuit of the transistor 16 which constitutes a constant current drive circuit for providing the common source current of the first stage differential amplifier formed by the field effect transistors 12 and 13, thus effecting a current modulation in accordance with the output signal. As a consequence, the operating point of the first stage differential amplifier varies in accordance with the amplitude of the signal, thereby decreasing the second order distortion. The operation of the embodiment shown in FIG. 5 will now be described with reference to FIGS. 6 through 8. FIG. 6 shows relationship between the gate-source voltage $V_{GS}$ and the drain current $I_D$ of a field effect transistor. FIG. 7 shows the relationship between the drain current $I_D$ and the mutual conductance gm and FIG. 8 shows the distortion wave generated by the current modulation.

A field effect transistor has a $V_{GS} - I_D$ characteristic of a square curve as shown in FIG. 6. The drain current $I_D$ is expressed by an equation $$I_D = a(V_{GS} - V_{GSoff})^2 \quad (1)$$

where $a$ represents a constant and $V_{GSoff}$ the voltage when $I_D = 0$. Further, mutual conductance gm is given by $$gm = \frac{\Delta I_D}{\Delta V_{GS}}$$

Accordingly, the mutual conductance gm is expressed by the following equation which is obtained by the partial differentiation of the term $I_D$ in equation (1) with $V_{GS}$, thus $$gm = \frac{\delta I_D}{\delta V_{GS}} = 2a(V_{GS} - V_{GSoff}) \quad (2)$$

From equations (1) and (2)

$$I_D = a \cdot \left(\frac{gm}{2a}\right)^2 \quad \text{therefore} \quad gm = 2\sqrt{aI_D}$$

Denoting $K = 2\sqrt{a}$, then $$gm = K \cdot \sqrt{I_D}$$

Accordingly, the relationship between the drain current $I_D$ and the mutual conductance gm is shown by FIG. 7.

As can be noted from FIG. 7, the mutual conductance of a field effect transistor increases in proportion to a power of ½ of the operating current. Accordingly, by modulating the operating current of the field effect transistor in accordance with the amplitude of the output, a gain modulation is provided, thus creating a secondary distortion.

In the embodiment shown in FIG. 5, the current flowing through the constant current device circuit of the differential amplifier is modulated by the output current through resistor 40. Neglecting the AC impedance of the diodes 25 and 26, the following modulation voltage is applied to the base electrode of the transistor 16 which constitutes a constant current circuit.

$$\Delta eb = \frac{E_0 \cdot R_4 \| R_5}{R_3 + R_4 \| R_5}$$

Where $R_3$, $R_4$ and $R_5$ represents the resistances of resistors 40, 23 and 29 respectively, $E_0$ is the output voltage and where it is assumed that the input impedance of the transistor 16 is sufficiently high. This modulation voltage causes the emitter current $I_e$ of the transistor 16 to vary thereby varying the resultant current $I_D$ of the field effect transistors 12 and 13 by $\Delta I_D$ which is expressed as follows.

$$\Delta I_D = \frac{E_0 \cdot R_4 \| R_5}{R_3 + R_4 \| R_5} \cdot \frac{1}{R_6}$$

Here $R_6$ represents the resistance of resistor 28 and it is assumed that the DC amplification coefficient $h_{fe}$ of the transistor 16 is sufficiently large.

The variation in the mutual conductance gm caused by $\Delta I_D$ is as follows.

$$\Delta gm = K \cdot \sqrt{\frac{E_0 \cdot R_4 \| R_5}{R_3 + R_4 \| R_5} \cdot \frac{1}{R_6}}$$

Figure 4:
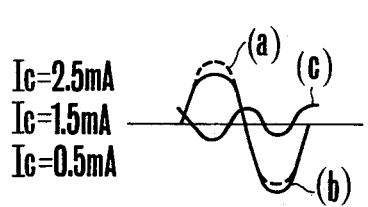
FIG. 4 shows waveforms used to explain the operation of the amplifier shown in FIG. 1.

The second order distortion generated as a result of the current modulation has a phase as shown in FIG. 8 which is opposite to that of the distortion shown in FIG. 4. This means that the second order distortion caused by the variation in the DC amplification coefficient $h_{fe}$ due to the collector current $I_C$ of the transistor 14 is decreased or cancelled. In FIG. 8, the wave (a) shows the fundamental wave, (b) the output wave and (c) the distortion.

Figure 9:
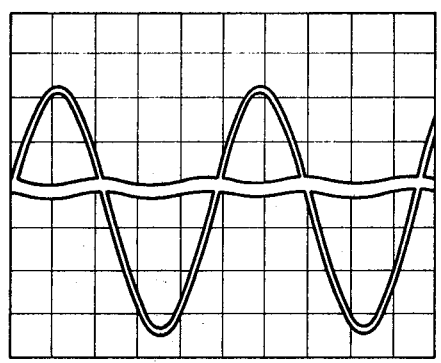
Figure 10:
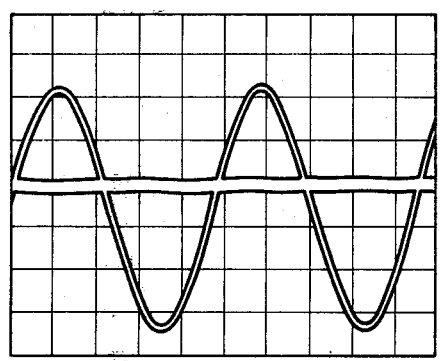
Figure 11:
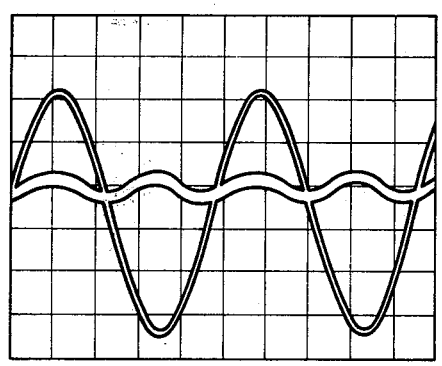

Since the purpose of the current modulation applied to the constant current drive circuit of the differential amplifier from the output terminal through the feedback resistor 40 is to decrease the second order distortion, if the modulation deviates from the optimum value the distortion would increase and its phase would reverse. FIGS. 9, 10 and 11 are waveforms showing how the distortion is varied by the adjustment of the feedback resistor 40. In FIG. 9, $R_3 = \infty$ and THD (total higher harmonic distortion) = 0.006%, in FIG. 10, $R_3$ = 220 Kohms and THD = 0.004%, while in FIG. 11, $R_3$ = 68 Kohms and THD = 0.016%.

In this manner, it is possible to effectively decrease or eliminate the second order distortion caused by the variation in the DC amplification coefficient due to the collector current, especially in a case wherein field effect transistors are used in the first stage differential amplifier.

Figure 12:
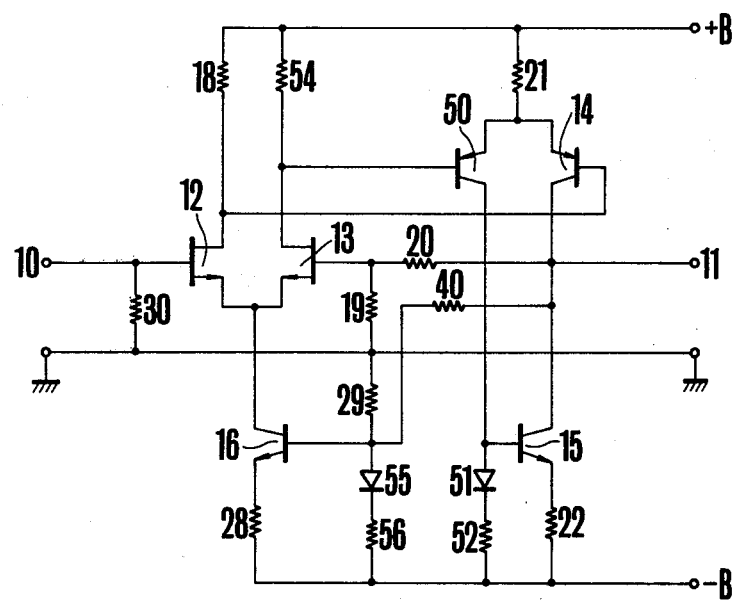
FIG. 12 is a connection diagram showing a modified embodiment of this invention.

FIG. 12 shows another embodiment of this invention, in which elements corresponding to those shown in FIG. 5 are designated by the same reference numerals. The embodiment shown in FIG. 12 is different from that shown in FIG. 5 as follows. The collector electrode of an emitter grounded PNP transistor 50 is connected to the base electrode of the transistor 15 and to the negative pole $-B$ of the source through a diode 51 and a resistor 52. The emitter electrode of the transistor 50 is connected to the emitter electrode of transistor 14 and the common juncture of these emitter electrodes is connected to the positive pole $+B$ through the resistor 21. The base electrode of the transistor 50 is connected to the drain electrode of the field effect transistor 13 and to the positive pole $+B$ of the source through a resistor 54. The base electrode of the transistor 16 is connected to the output terminal 11 though the resistor 40 and to the ground via the resistor 29. Further, the base electrode is connected to the negative pole $-B$ through series-connected diode 55 and resistor 56.

In operation, an input signal applied to the input terminal 10 is amplified by the field effect transistor 12, and further amplified by the second stage transistor 14 thus producing an amplified output at the output terminal 11. In the first stage differential amplifier comprising the field effect transistors 12 and 13 the output is fed back to the base electrode of the transistor 16 acting as the constant current drive circuit for the source electrodes of the field effect transistors for effecting a current modulation. Accordingly, the operating point of the first stage differential amplifier varies in accordance with the amplitude of the output signal thus decreasing or eliminating the second order distortion generated by the transistor 14 in the same manner as has been described in connection with FIG. 5.

As above described, according to this invention it is possible to more efficiently decrease or eliminate the second order distortion caused by the variation in the DC amplification coefficient due to the collector current of a transistor than with the prior art amplifier device with simple circuit construction, and without using complicated circuit construction. This not only decreases the cost of manufacturing but also improves the characteristics and reliability of the device.

Although the invention has been shown and described in terms of some preferred embodiments thereof it will be clear that many changes and modifications are obvious to one skilled in the art without departing from the true spirit and scope of the invention as defined in the appended claims.

What is claimed is:

1. In an amplifier device comprising a differential amplifier including a pair of parallel-connected field effect transistors having commonly connected source electrodes, a transistor amplifier responsive to the output of said differential amplifier and acting as a class "A" amplifer, an output terminal connected to the output electrode of said transistor amplifier for producing an output signal which is in-phase with the input signal applied to the input of the differential amplifier, and a constant current drive circuit connected to the commonly connected source electrodes of said field effect transistors for supplying said differential amplifier as a constant current source, the improvement which comprises a passive impedance element connected directly between said output terminal and said constant current drive circuit for modulating the current supplied by said constant current drive circuit to the differential amplifier with a positive feedback signal according to the amplitude of the output signal.

2. The improvement according to claim 1 wherein said impedance element comprises a resistor.

3. The improvement according to claim 1 wherein said constant current drive circuit comprises a second transistor amplifier with its output electrode connected to said commonly connected source electrodes of the field effect transistors and a diode and second impedance element serially connected between the base electrode of said second transistor and a voltage source, and wherein one end of said first mentioned impedance element is connected to the juncture between said base electrode and said diode and second impedance element.

4. The improvement according to claim 3 wherein the second impedance element comprises a single resistor connected in series circuit relationship with a diode between the base electrode of the second transistor and the voltage source.

5. The improvement according to claim 1 in which said class "A" amplifier is a differential amplifier.

* * * * *